United States Patent [19]

Ohshima et al.

[11] 4,426,234
[45] Jan. 17, 1984

[54] METHOD OF FORMING REPRODUCIBLE IMPURITY ZONE OF GALLIUM OR ALUMINUM IN A WAFER BY IMPLANTING THROUGH COMPOSITE LAYERS AND DIFFUSION ANNEALING

[75] Inventors: Jiro Ohshima, Yokohama; Yutaka Koshino, Yokosuka; Takashi Ajima, Kamakura; Toshio Yonezawa, Yokosuka, all of Japan

[73] Assignee: Tokyo Shibaura Denki Kabushiki Kaisha, Japan

[21] Appl. No.: 327,190

[22] Filed: Dec. 3, 1981

[30] Foreign Application Priority Data

Dec. 4, 1980 [JP] Japan ................ 55-171304

[51] Int. Cl.³ ............... H01L 21/225; H01L 21/425; H01L 21/74
[52] U.S. Cl. .................. 148/1.5; 29/576 B; 148/187; 148/188; 357/91
[58] Field of Search ............. 148/1.5. 188; 29/576 B; 357/91; 148/187

[56] References Cited

U.S. PATENT DOCUMENTS

| 4,063,967 | 12/1977 | Graul et al. | 148/1.5 |
| 4,063,973 | 12/1977 | Kirita et al. | 148/188 |
| 4,102,715 | 7/1978 | Kambara | 148/188 |
| 4,146,413 | 3/1979 | Yonezawa et al. | 148/188 |
| 4,296,426 | 10/1981 | Giles | 357/23 |
| 4,313,255 | 2/1982 | Shinozaki et al. | 148/188 |

FOREIGN PATENT DOCUMENTS 43-763613 3/1968 Japan.

OTHER PUBLICATIONS

Baliga, B. Jayant, Journal of the Electrochemical Society-Solid-State Science and Technology, vol. 126, No. 2, pp. 292-296, Feb. 1979.

*Primary Examiner*—Upendra Roy
*Attorney, Agent, or Firm*—Finnegan, Henderson, Farabow, Garrett and Dunner

[57] ABSTRACT

The invention discloses a method for fabricating a semiconductor device comprising the steps of: forming, on an entire surface of a semiconductor substrate of one conductivity type, a first thin film of a diffusion coefficient greater than a diffusion coefficient of the substrate; forming, on an entire surface of the first thin film, a second thin film having a diffusion coefficient smaller than the diffusion coefficient of the first thin film; ion-implanting an impurity through the second thin film into the first thin film to form an impurity region, said impurity having a conductivity type opposite to the conductivity type of the substrate; and effecting annealing to set a junction depth of the impurity region to a predetermined value. According to the method of the invention, an impurity region having a desired sheet resistivity and a desired diffusion depth can be formed in the semiconductor substrate with excellent reproducibility and control. The formation of the lattice defect can be prevented and the carrier life time can be improved. Gallium is preferably used as the impurity according to the invention.

6 Claims, 3 Drawing Figures

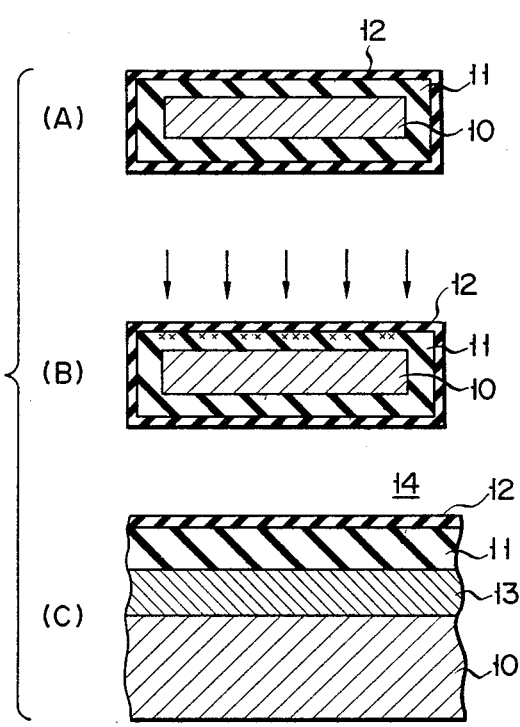
F I G. 2
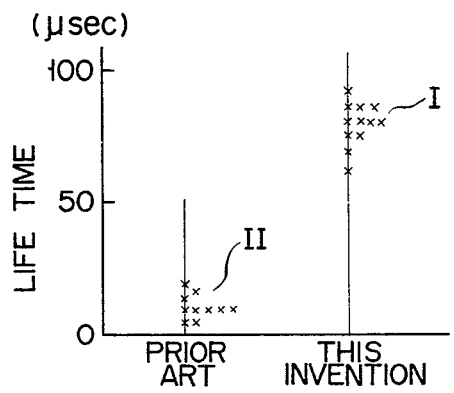
F I G. 3

METHOD OF FORMING REPRODUCIBLE IMPURITY ZONE OF GALLIUM OR ALUMINUM IN A WAFER BY IMPLANTING THROUGH COMPOSITE LAYERS AND DIFFUSION ANNEALING

BACKGROUND OF THE INVENTION

The present invention relates to a method for fabricating a semiconductor device.

A conventional semiconductor device having a p-n junction is manufactured in the manner as shown in FIG. 1. Referring to FIG. 1, a boat 2 with a number of n-type semiconductor substrates 1 mounted thereon is housed in a diffusion envelope 3. A diffusion source 4 of Ga or Ga-Ge is also housed in the diffusion envelope 3 to perform the closed capsule diffusion and to form a Ga-doped p-type region in each semiconductor substrate 1.

However, with this method for fabricating the semiconductor device, the amount of the impurity (Ga) to be doped in the semiconductor substrate 1 must be controlled based on the weight of the diffusion source 4. For this reason, it is difficult to obtain p-type regions of desired sheet resistivity and junction depth. Variations in the properties of the p-type regions are also great from one lot to another of the diffusion furnace 3. Another method is also proposed in Japanese Pat. No. 763613 wherein an impurity region is formed by implanting, by the ion implantation method, an impurity into the semiconductor substrate not under a closed condition but in an open atmosphere. However, the inventors have determined that when the impurity is gallium, the implanted gallium ions are diffused to the outside from the semiconductor substrate and a protective film formed thereover, so that the formation of the desired impurity region has been difficult.

SUMMARY OF THE INVENTION

It is an object of the present invention to provide a method for fabricating a semiconductor device wherein an impurity region of a desired sheet resistivity and a desired diffusion depth may be formed in a semiconductor substrate with excellent reproducibility and control.

In order to achieve this object, there is provided according to the present invention a method for fabricating a semiconductor device comprising the steps of: forming, on an entire surface of a semiconductor substrate of one conductivity type, a first thin film of a diffusion coefficient greater than a diffusion coefficient of said substrate; forming, on an entire surface of said first thin film, a second thin film having a diffusion coefficient smaller than the diffusion coefficient of said first thin film; ion-implanting an impurity through the second thin film into the first thin film to form an impurity region, said impurity having a conductivity type opposite to the conductivity type of said substrate; and effecting annealing to set a junction depth of said impurity region to a predetermined value.

BRIEF DESCRIPTION OF THE DRAWINGS

FIGS. 2A to 2C are sectional views showing, in sequential order, the method for fabricating a semiconductor device according to the present invention; and FIG. 3 is a graph showing the life time distribution of the impurity region.

DETAILED DESCRIPTION OF THE PREFERRED EMBODIMENTS

Figure 1:
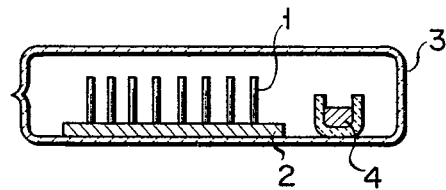
FIG. 1 is a sectional view showing a conventional method for fabricating a semiconductor device.

The embodiment of the present invention will now be described with reference to FIGS. 2A to 2C.

As shown in FIG. 2A, a first thin film 11 of silicon dioxide is formed by thermal oxidation to a thickness of about 1.5 $\mu$m on the entire surface of an n-type silicon semiconductor substrate 10 having an index of plane (1,1,1) and a sheet resistivity of 50 $\Omega$·cm. A second thin film 12 of silicon nitride is then formed on the entire surface of the first thin film 11 to a thickness of about 300 Å. Instead of forming the first thin film 11 of silicon dioxide, the first thin film 11 of silicon oxynitride or polycrystalline silicon may be formed. The second thin film 12 need not be made of silicon nitride but may be made of aluminum oxide, silicon carbide, or silicon oxynitride. The second thin film 12 is formed to prevent the "out diffusion" of an impurity which is to be ion-implanted in a step to be performed later. The second thin film 12 is preferably formed to a thickness of 50 Å or more.

Next, as shown in FIG. 2B, an impurity, such as Ga is ion-implanted into the first thin film 11 through the second thin film 12 at an acceleration voltage of 150 keV and a dose of $5 \times 10^{14}$ ions/cm$^2$. Under these ion implantation conditions, more than 99% of the Ga ions are present in the first thin film 11 and/or the second thin film 12 according to the theory of LSS.

According to the theory of LSS, the distribution of the implanted ions in an object to be implanted is determined by the type of the element implanted, the acceleration voltage for the ion implantation, and the type of the object to be implanted.

Then, as shown in FIG. 2C, the entire structure is subjected to annealing in a nitrogen atmosphere at 1,200° C., for example, to diffuse the implanted gallium from the first thin film 11 to the semiconductor substrate 10. A semiconductor device 14 is thus fabricated wherein a p-type impurity region 13 having a sheet resistivity of about 80 ohm/square and a junction depth of about 30 m is formed in the semiconductor substrate 10.

In the embodiment described above, Ga ions were used as an impurity for ion implantation. However, aluminum may alternatively be used.

In this manner, according to the method of the present invention, after forming, on the surface of the semiconductor substrate 10, the first thin film 11 having a diffusion coefficient greater than that of the substrate 10 and the second thin film 12 having a diffusion coefficient smaller than that of the first thin film in the order mentioned, a desired impurity is ion-implanted into the semiconductor substrate 10 through these thin films 11 and 12. Therefore, the out diffusion of the implanted ions especially by the second thin film 12 may be prevented, so that the implanted ions may be diffused into the first thin film 11 or the semiconductor substrate 10. Furthermore, since the impurity diffused in the first thin film 11 or the semiconductor substrate 10 is diffused to a predetermined depth by annealing, the impurity region 13 having a predetermined junction depth may be formed with ease. In addition to this, the dose of the ions to be implanted may be correctly set, and the surface of the second thin film 12 is not exposed to an atmosphere containing an impurity of high concentration as in the conventional method. For this reason, the impurity concentration at the surface of the second thin film 12 after annealing may be kept at an extremely low value. The formation of the lattice defect in the impurity region 13 may be prevented, so that the carrier life time may be improved, and the element characteristics and reliability may be improved.

Consequently, the impurity region 13 having a desired sheet resistivity and a desired junction depth may be easily formed in the semiconductor substrate 10 with good reproducibility and control.

As an example, the carrier life time of the semiconductor substrate 10 having the impurity region 13 of the semiconductor device 14 fabricated according to the method of the present invention and the carrier life time of the semiconductor substrate having an impurity region formed by the conventional method for fabricating the semiconductor device involving the closed capsule diffusion were examined. The obtained results are shown in FIG. 3. Referring to FIG. 3, symbol (I) represents the carrier life time distribution of the impurity region formed according to the present invention, whereas symbol (II) represents the carrier life time distribution of the impurity region formed according to the conventional method. The sheet resistivity $\rho s$ of the impurity region 13 obtained by the method of the present invention was 150 ohm/square and the junction depth thereof was 40 $\mu$m.

What we claim is:

1. A method for fabricating a semiconductor device comprising the steps of:
   a. forming, on a surface of a silicon substrate, a first thin film having a gallium diffusion coefficient greater than the gallium diffusion coefficient of said substrate;
   b. forming on a surface of said first thin film, a second thin film having a gallium diffusion coefficient smaller than said gallium diffusion coefficient of said first thin film;
   c. ion-implanting gallium through said second thin film into said first thin film to form a P-type impurity region; and
   d. effecting annealing to set a junction depth of said P-type impurity region to a predetermined value.

2. A method according to claim 1, wherein said first thin film is a member selected from the group consisting of silicon dioxide film, silicon oxynitride film, and polycrystalline silicon film, and said second thin film is a member selected from the group consisting of silicon nitride film, aluminum oxide film, silicon carbonide film, and silicon oxynitride film.

3. A method according to claim 1 wherein said substrate has an N conductivity type.

4. A method for fabricating a semiconductor device comprising the steps of:
   a. forming, on a surface of a silicon substrate, a first thin film having an aluminum diffusion coefficient greater than the aluminum diffusion coefficient of said substrate;
   b. forming, on a surface of said first thin film, a second thin film having an aluminum diffusion coefficient smaller than said aluminum diffusion coefficient of said first thin film;
   c. ion implanting aluminum through said second thin film into said first thin film to form a P-type impurity region; and
   d. affecting annealing to set a depth of said P-type impurity region to a predetermined value.

5. A method according to claim 4, wherein said first thin film is a member selected from the group consisting of silicon dioxide film, silicon oxynitride film, and polycrystalline silicon film, and said second thin film is a member selected from the group consisting of silicon nitride film, aluminum oxide film, silicon carbonide film, and silicon oxynitride film.

6. A method according to claim 4 wherein said substrate has N conductivity type.

* * * * *